(12) United States Patent
Liu et al.

(10) Patent No.: US 11,329,052 B2
(45) Date of Patent: May 10, 2022

(54) METHOD OF PROCESSING DRAM

(71) Applicant: Applied Materials, Inc., Santa Clara, CA (US)

(72) Inventors: Lequn Liu, San Jose, CA (US); Priyadarshi Panda, Newark, CA (US); Jonathan C. Shaw, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 8 days.

(21) Appl. No.: 16/939,361

(22) Filed: Jul. 27, 2020

(65) Prior Publication Data

US 2021/0035982 A1 Feb. 4, 2021

Related U.S. Application Data

(60) Provisional application No. 62/882,418, filed on Aug. 2, 2019.

(51) Int. Cl.
*H01L 27/108* (2006.01)
*H01L 21/67* (2006.01)

(52) U.S. Cl.
CPC .. *H01L 27/10885* (2013.01); *H01L 21/67167* (2013.01); *H01L 21/67213* (2013.01)

(58) Field of Classification Search
CPC ......... H01L 27/10885; H01L 21/67167; H01L 21/67213
See application file for complete search history.

(56) References Cited

U.S. PATENT DOCUMENTS

| | | | | |
|---|---|---|---|---|
| 6,472,302 B1* | 10/2002 | Lee | ................... | H01L 21/28525 257/E21.166 |
| 2002/0058414 A1* | 5/2002 | Derderian | ............... | H01L 28/84 438/686 |
| 2003/0003640 A1* | 1/2003 | Lee | .................... | H01L 21/76895 438/199 |
| 2004/0245577 A1* | 12/2004 | Bhattacharyya | .... | H01L 27/1203 257/369 |
| 2006/0292800 A1* | 12/2006 | Shih | ....................... | H01L 27/115 438/261 |
| 2007/0173017 A1* | 7/2007 | Eitan | ................. | H01L 27/11568 438/257 |
| 2008/0057688 A1 | 3/2008 | Jeong et al. | | |
| 2018/0337052 A1* | 11/2018 | Ramalingam | ....... | C23C 14/3407 |
| 2020/0126844 A1* | 4/2020 | Panda | ............... | H01L 21/67184 |
| 2020/0126996 A1* | 4/2020 | Panda | ................. | H01L 21/0337 |

FOREIGN PATENT DOCUMENTS

KR 20090107821 A 10/2009

OTHER PUBLICATIONS

PCT International Search Report and Written Opinion in PCT/US2020/043932 dated Nov. 10, 2020, 10 pages.

* cited by examiner

*Primary Examiner* — Mohammed Shamsuzzaman
(74) *Attorney, Agent, or Firm* — Servilla Whitney LLC

(57) ABSTRACT

Methods of forming a DRAM bit line to improve line edge roughness (LER) and lower resistance are described. The method comprises implanting an inert species into a bit line metal layer having a first grain size on a substrate to form an amorphized bit line metal layer having a second grain size smaller than the first grain size. A film stack is then deposited on the amorphized bit line metal layer. The film stack and amorphized bit line metal layer are etched to form a patterned film stack on the substrate. The patterned film stack on the substrate is thermally annealed.

13 Claims, 3 Drawing Sheets

METHOD OF PROCESSING DRAM

CROSS-REFERENCE TO RELATED APPLICATIONS

This application claims priority to U.S. Provisional Application No. 62/882,418, filed Aug. 2, 2019, the entire disclosure of which is hereby incorporated by reference herein.

TECHNICAL FIELD

Embodiments of the present invention pertain to the field of electronic device manufacturing. In particular, embodiments pertain to methods used for dynamic random access memory (DRAM) bit line stack processes.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Reducing the size of integrated circuits (ICs) results in improved performance, increased capacity, and/or reduced cost. Each size reduction requires more sophisticated techniques to form the ICs. Shrinking transistor size, for example, allows for the incorporation of an increased number of memory or logic devices on a chip, lending to the fabrication of products with increased capacity. The drive for ever-more capacity, however, is not without issue. The necessity to optimize the performance of each device becomes increasingly significant.

Non-volatile memory is a class of integrated circuits in which the memory cell or element does not lose its state after the power supplied to the device is turned off. The earliest computer memories, made with rings of ferrite that could be magnetized in two directions, were non-volatile. As semiconductor technology has evolved into higher levels of miniaturization, the ferrite devices were abandoned for the more commonly known volatile memories, such as DRAM (dynamic random access memories) and SRAMs (static-RAMs). As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells. The rows on access transistors are linked by word lines, and the transistor inputs/outputs are linked by bit lines. Historically, DRAM capacitors have evolved from planar polysilicon-oxide-substrate plate capacitors to 3-D structures which have diverged into "stack" capacitors with both plates above the substrate, and "trench" capacitors using an etched cavity in the substrate as the common plate. In such DRAM devices, it is difficult to form DRAM bit lines with both low resistance and good line edge roughness at the same time.

Accordingly, there is a need for methods of manufacturing DRAM devices which have bit lines with both low resistance and good line edge roughness at the same time.

SUMMARY

One or more embodiments of the disclosure are directed to a method of forming a DRAM bit line, the method comprising: implanting an inert species into a bit line metal layer having a first grain size on a substrate to form an amorphized bit line metal layer having a second grain size smaller than the first grain size; depositing a film stack on the amorphized bit line metal layer; etching the film stack and amorphized bit line metal layer to form a patterned film stack on the substrate; and thermally annealing the patterned film stack on the substrate.

One or more embodiments of the disclosure are directed to a cluster tool for performing dynamic random access memory (DRAM) bit line stack processes. In one embodiment, a cluster tool comprises: a central transfer station configured to receive a substrate having a polysilicon plug formed thereon and to transfer the substrate to and from a plurality of processing chambers each independently connected to the central transfer station for performing one of a plurality of DRAM bit line processes on the substrate, the plurality of processing chambers comprising: a pre-cleaning chamber configured to remove a native oxide from a surface of the substrate; a barrier layer deposition chamber configured to deposit a barrier layer on the surface of the substrate; a bit line metal deposition chamber configured to deposit a bit line metal layer on the surface of the substrate; and a hard mask deposition chamber configured to deposit a hard mask layer on the surface of the substrate.

One or more embodiments of the disclosure are directed to non-transitory computer readable medium including instructions, that, when executed by a controller of a processing chamber, cause the processing chamber to perform operations of: controlling implantation of an inert species into a bit line metal layer having a first grain size on a substrate to form an amorphized bit line metal layer having a second grain size smaller than the first grain size; controlling deposition of a film stack on the amorphized bit line metal layer; receiving data for a third configuration to control etching the film stack and amorphized bit line metal layer to form a patterned film stack on the substrate; and controlling thermally annealing the patterned film stack on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
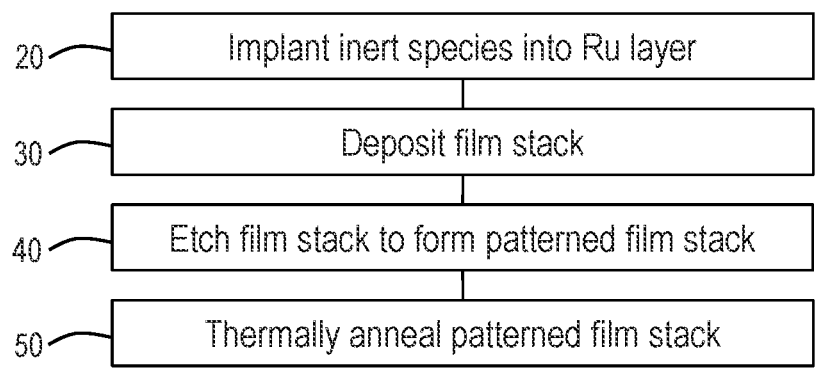
FIG. 1 depicts a flow process diagram of a method according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells. The rows on access transistors are linked by word lines, and the transistor inputs/outputs are linked by bit lines. Historically, DRAM capacitors have evolved from planar polysilicon-oxide-substrate plate capacitors to 3-D structures which have diverged into "stack" capacitors with both plates above the substrate, and "trench" capacitors using an etched cavity in the substrate as the common plate.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

Embodiments of the present disclosure relate to methods for processing DRAM bit lines so as to advantageously improve line edge roughness (LER) and lower resistance.

FIG. 1 depicts a flow diagram of a method 10 in accordance with one or more embodiments of the present disclosure. With reference to FIG. 1, the method 10 begins at operation 20 by implanting an inert species into a bit line metal layer. At operation 30, a film stack is deposited. At operation 40, the film stack is etched for form a patterned film stack. At operation 50, the patterned film stack is thermally annealed.

Figure 2:
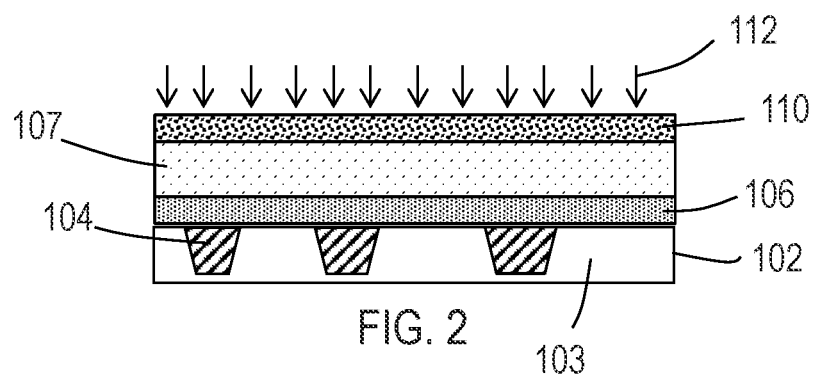
FIG. 2 depicts an electronic device in accordance with one or more embodiments.
Figure 3:
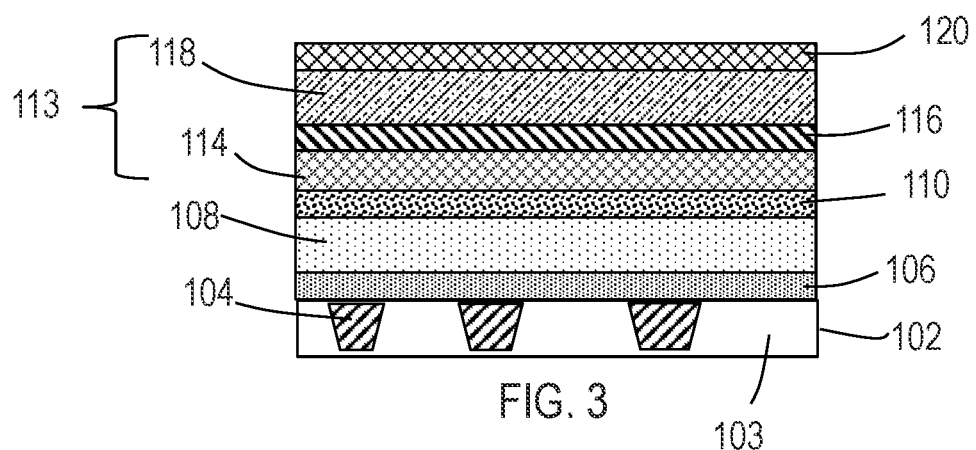
FIG. 3 depicts an electronic device in accordance with one or more embodiments.

FIGS. 2 to 4C depict cross-section views of an electronic device 100 according to one or more embodiments. With reference to FIGS. 2 and 3, an inert species 112 is implanted into a bit line metal layer 107 having a first grain size on a substrate 102 to form an amorphized bit line metal layer 108 having a second grain size smaller than the first grain size. In one or more embodiments, the bit line metal layer 107 is deposited by any suitable technique known to the skilled artisan and is any suitable material known to the skilled artisan. In one or more embodiments, the bit line metal layer 107 comprises ruthenium having a first grain size. In one or more embodiments, the amorphized bit line metal layer 108 comprises amorphized ruthenium, having a second grain size smaller than the first grain size.

In one or more embodiments, the first grain size is in a range of about 5 Å to about 20 Å, as measured by atomic force microscopy (AFM). In one or more embodiments, the second grain size is in a range of about 5 Å to about 20 Å, as measured by atomic force microscopy (AFM). In one or more embodiments, the third grain size is in a range of about 5 Å to about 200 Å, as measured by atomic force microscopy (AFM).

In one or more embodiments, the inert species 112 comprises one or more of argon (Ar), helium (He), neon (Ne), krypton (Kr), xenon (Xe), or radon (Rn). In one or more embodiments, the dosage of the inert species 112 implanted into the bit line metal layer 107 is greater than $1 \times 10^{15}$ atoms/cm$^2$. In one or more embodiments, implanting the inert species 112 comprises a beamline implant or plasma implant (PLAD) of the inert species 112.

In some embodiments, the method further comprises depositing a cap layer 110 on the bit line metal layer 107 before implanting the inert species 112. The cap layer 110 can be deposited by any method known to the skill artisan including, but not limited to, atomic layer deposition (ALD), chemical vapor deposition (CVD), or physical vapor deposition (PVD). In one or more embodiments, the cap layer has a thickness in a range of about 20 Å to about 100 Å, including about 25 Å to about 75 Å, or about 20 Å to about 85 Å. In one or more embodiments, the cap layer 110 has a thickness of about 20 Å, or about 30 Å, or about 40 Å, or about 50 Å, or about 60 Å, or about 70 Å, or about 80 Å, or about 90 Å, or about 100 Å. In one or more embodiments, the cap layer 110 comprises one or more of a nitride or an oxide. In one or more embodiments, the cap layer 110 comprises one or more of silicon nitride (SiN), or silicon oxide (SiO).

In one or more embodiments, the substrate 102 has a surface comprising a first surface material 103 and a second surface material 104. In one or more embodiments, the first surface material 103 comprises an oxide. In one or more embodiments, the second surface material comprises a second surface material 104 comprising polysilicon. In one or more embodiments, the substrate 102 comprises a polysilicon plug (poly plug) as the second surface material 104, which was previously fabricated on the substrate.

In one or more embodiments the substrate 102 comprises a barrier layer 106 on the top surface of the substrate 102. In one or more embodiments, the barrier layer comprises a barrier metal. In one or more embodiments, the barrier layer 106 comprises one or more of tantalum (Ta), titanium (Ti), tungsten (W), tantalum nitride (TaN), titanium nitride (TiN), or tungsten nitride (WN).

With reference to FIG. 3, a film stack 113 is deposited on the amorphized bit line metal layer 108. In one or more embodiments, the film stack 113 comprises one or more layer selected from a nitride layer, an oxide layer, a carbon hard mask layer, or an oxynitride layer. In the embodiment depicted in FIG. 3, the film stack 113 comprises a nitride layer 114, an oxide layer 116, a carbon hard mask layer 118, and an oxynitride layer 120.

Figure 4A:
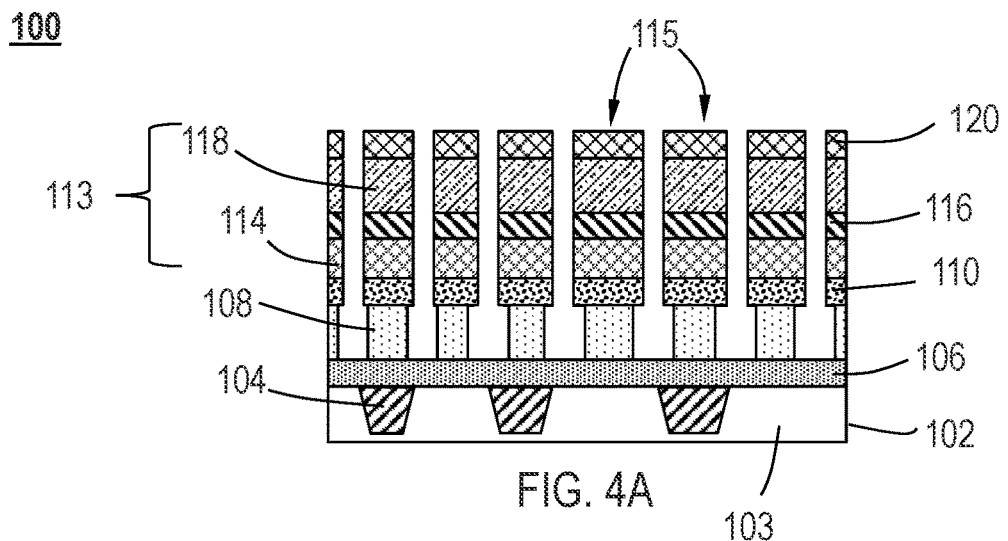
FIG. 4A depicts an electronic device in accordance with one or more embodiments.
Figure 4B:
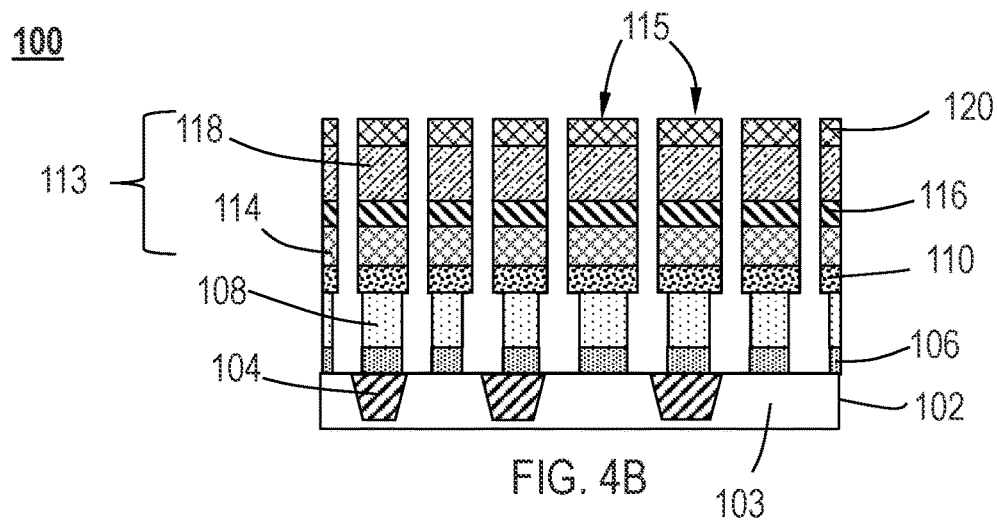
FIG. 4B depicts an electronic device in accordance with one or more embodiments.
Figure 4C:
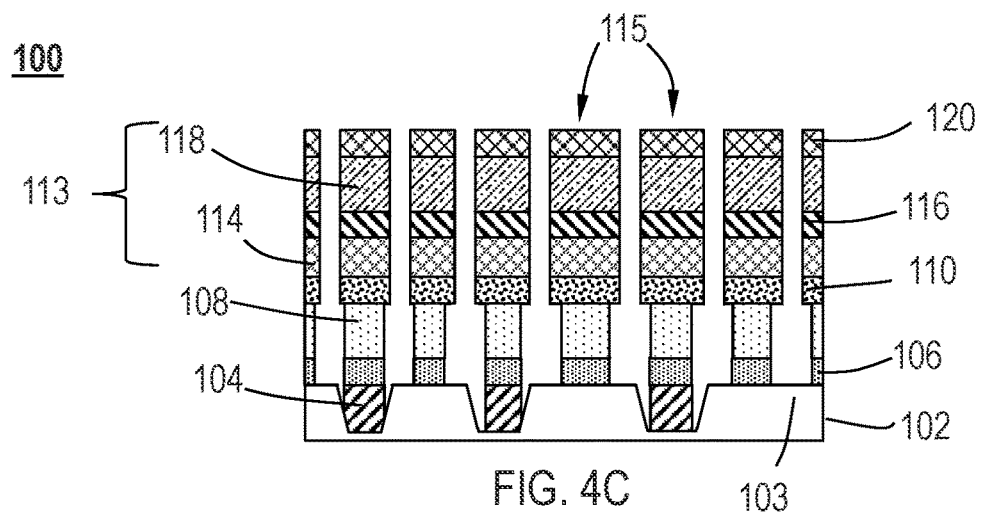
FIG. 4C depicts an electronic device in accordance with one or more embodiments.

With reference to FIGS. 4A to 4C, the film stack 113 and amorphized bit line metal layer 108 are etched to form a patterned film stack on the substrate 102.

Referring to FIG. 4A, the substrate is etched such that the film stack 113 and the amorphized bit line metal layer 108 are etched to form a plurality of DRAM bit lines 115. In one or more embodiments, one or more of the barrier layer 106 or the second surface material 104 are etched. Referring to FIG. 4B, the barrier layer 106 is etched. Referring to FIG. 4C, in one or more embodiments, the second surface material 104 is etched. Because the second grain size is small, it helps to improve the etch uniformity and thus reduce the line edge roughness of bit line.

In one or more embodiments, the patterned film stack on the substrate is then thermally annealed. In one or more embodiments, thermally annealing the substrate comprises exposing the substrate to a temperature in a range of about 500° C. to about 900° C. In one or more embodiments, thermally annealing the substrate increases the grain size of the amorphized bit line metal layer 108 from the second grain size to a third grain size larger than the second grain size, and, thus, larger grain size helps to reduce the bit line contact resistance Rs and sheet resistance Rc. In one or more embodiments, the third grain size is in a range of about 5 Å to about 20 Å, as measured by atomic force microscopy (AFM).

In one or more embodiments, the device produce according to the embodiments described herein has a reduced line edge roughness of the bit line when compared to a device produced not in accordance with the methods describe herein. Additionally, in one or more embodiments, the bit line resistance, Rc and Rs, of a device produced in accordance with the methods described herein is lower than the bit line resistance of a device that is not produced according to the methods described herein. In one or more embodiments, the line edge roughness can be measure by metrology or SEM, and the resistance Rc and Rs can be measured by the electrical performance of DRAM or bit line test module for bit line resistance Rc and Rs.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Figure 5:
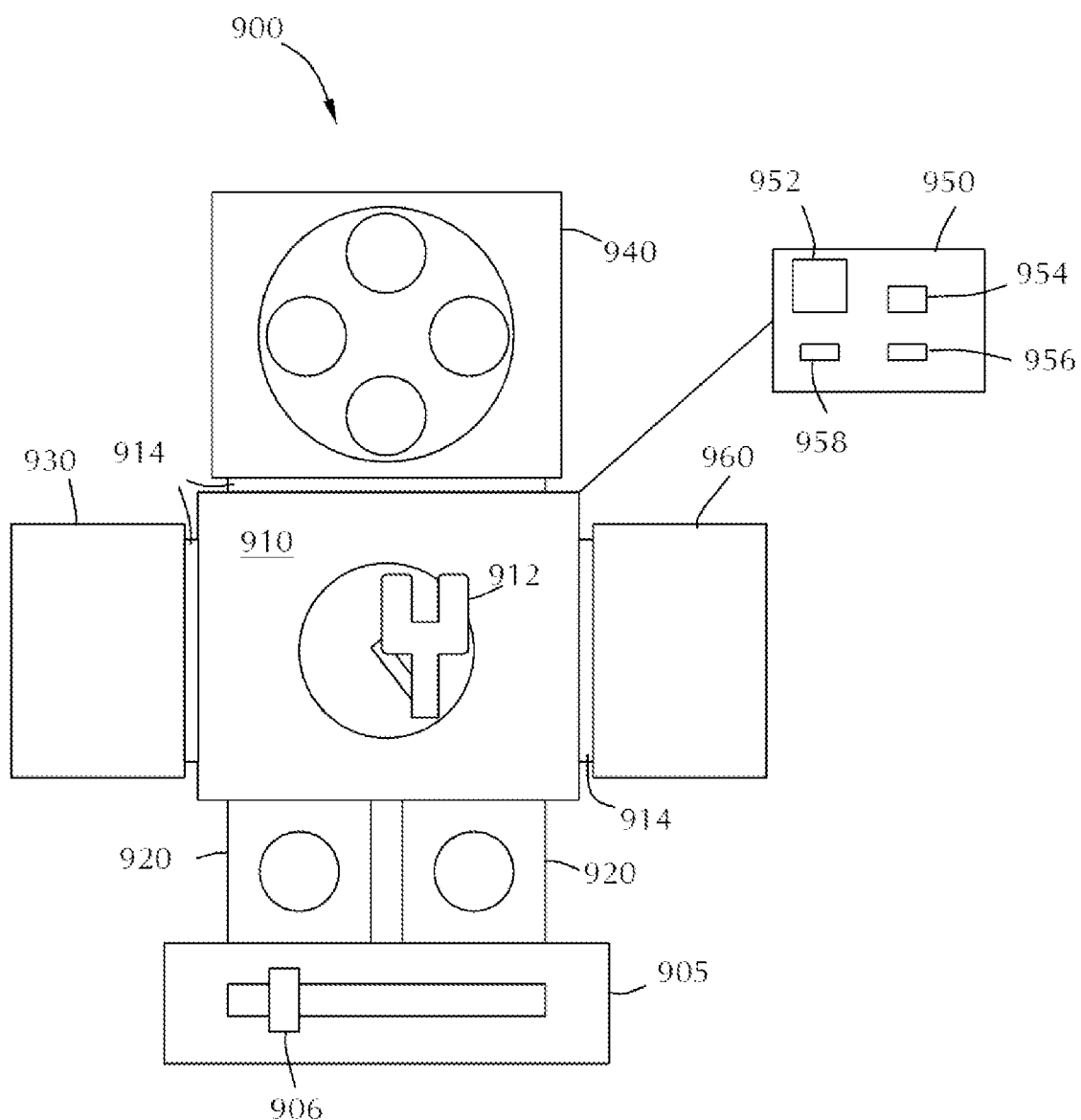
FIG. 5 depicts a block diagram of a cluster tool system in accordance with one or more embodiment of the disclosure.

With reference to FIG. 5, additional embodiments of the disclosure are directed to a processing system 900 for executing the methods described herein. FIG. 5 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 5, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900. In one or more embodiments, the pre-clean chamber 920 is configured to remove a native oxide from a surface of the substrate.

A first processing chamber 930 can be connected to the central transfer station 910. The first processing chamber 930 can be configured as an inert species implantation chamber configured to implant one or more inert species on a bit line metal layer. The substrate can be moved to and from the processing chamber 930 by the robot 912 passing through isolation valve 914.

Processing chamber 940 can also be connected to the central transfer station 910. In some embodiments, processing chamber 940 comprises a barrier layer deposition chamber configured to deposit a barrier layer on a surface of the substrate and is fluid communication with one or more reactive gas sources to provide flows of reactive gas to the processing chamber 940 to deposit the barrier layer on the substrate. The substrate can be moved to and from the processing chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In other embodiments, processing chamber 940 comprises a bit line metal deposition chamber configured to deposit a bit line metal layer on the surface of the substrate.

In some embodiments, each of the processing chambers 930, 940, 945 and 960 are configured to perform different portions of the processing method. For example, processing chamber 930 may be configured to implant one or more inert species into a bit line metal layer, processing chamber 940 may be configured to deposit a bit line metal layer on a surface of the substrate, processing chamber 945 may be configured as a metrology station or to perform purge of the processing chamber and processing chamber 960 may be configured to perform a second purge process. The skilled artisan will recognize that the number and arrangement of individual processing chambers on the tool can be varied and that the embodiment illustrated in FIG. 5 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; expose the substrate to a metal-organic precursor; expose the substrate to an oxidant to react with the metal-organic precursor; purge the processing chamber of the metal-organic precursor; purge the processing chamber of the oxidant; and repeat the cycle.

One or more embodiments are directed to a cluster tool for performing dynamic random access memory (DRAM) bit line stack processes. In one or more embodiments, the cluster tool comprises a central transfer station configured to receive a substrate having a polysilicon plug formed thereon and to transfer the substrate to and from a plurality of processing chambers each independently connected to the central transfer station for performing one of a plurality of DRAM bit line processes on the substrate, the plurality of processing chambers comprising: a pre-cleaning chamber configured to remove a native oxide from a surface of the substrate; an implantation chamber configure to implant one or more inert species on a bit line metal layer; a barrier layer deposition chamber configured to deposit a barrier layer on the surface of the substrate; a bit line metal deposition chamber configured to deposit a bit line metal layer on the surface of the substrate; and a hard mask deposition chamber configured to deposit a hard mask layer on the surface of the substrate. In one or more embodiments, the bit line metal layer comprises a bit line metal layer. In one or more embodiments, the implantation chamber is configured to implant an inert species into a surface of the bit line metal layer.

In one or more embodiments, the cluster tool further comprises an annealing chamber configured to perform an annealing process on the substrate; and a capping chamber configured to deposit a capping layer on the surface of the substrate. In one or more embodiments, the cluster tool further comprises a controller configured to control the plurality of processing chambers.

One or more embodiments are directed to a non-transitory computer readable medium including instructions, that, when executed by a controller of a processing chamber, cause the processing chamber to perform the operations of controlling implantation of an inert species into a bit line metal layer having a first grain size on a substrate to form an amorphized bit line metal layer having a second grain size smaller than the first grain size; controlling deposition of a film stack on the amorphized bit line metal layer; receiving data for a third configuration to control etching the film stack and amorphized bit line metal layer to form a patterned film stack on the substrate; and controlling thermally annealing the patterned film stack on the substrate.

In one or more embodiments, a beamline implant process is used to implant the inert species into the bit line metal layer 107. In such embodiments, the substrate is transferred out and then placed into a beamline implant tool to run beamline implantation, then transfer back to a cluster system for the remaining film stack deposition.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a DRAM bit line, the method comprising:
    implanting an inert species into a bit line metal layer having a first grain size on a substrate to form an amorphized bit line metal layer having a second grain size smaller than the first grain size;
    depositing a film stack on the amorphized bit line metal layer;
    etching the film stack and the amorphized bit line metal layer to form a patterned film stack on the substrate, the patterned film stack comprising a plurality of the DRAM bit lines; and
    thermally annealing the patterned film stack on the substrate to form a third grain size, the amorphized bit line metal layer comprising the third grain size and wherein the thermally annealing to a temperature in a range of about 500° C. to about 900° C. increases the second grain size of the amorphized bit line metal layer to the third grain size larger than the second grain size.

2. The method of claim 1, wherein the substrate has a surface comprising a first surface material and a second surface material, and a barrier layer on the surface of the substrate, the first surface material comprising an oxide and the second surface material comprising polysilicon.

3. The method of claim 2, wherein the barrier layer comprises a barrier metal.

4. The method of claim 1, wherein implanting comprises one or more of a beamline implant or a plasma implant of the inert species.

5. The method of claim 4, wherein the inert species comprises one or more of argon (Ar), helium (He), neon (Ne), krypton (Kr), xenon (Xe), or radon (Rn).

6. The method of claim 4, wherein a dosage of the inert species implanted into the bit line metal layer is greater than $1\times10^{15}$ atoms/cm$^2$.

7. The method of claim 1, further comprising depositing a cap layer on the bit line metal layer before implanting the inert species.

8. The method of claim 7, where the cap layer has a thickness in a range of about 20 Å to about 100 Å.

9. The method of claim 7, wherein the cap layer comprises one or more of a nitride or an oxide.

10. The method of claim 1, wherein the film stack comprises one or more layer selected from a nitride layer, an oxide layer, a carbon hard mask layer, or an oxynitride layer.

11. The method of claim 2, further comprising etching one or more of the barrier layer or the second surface material.

12. The method of claim 1, wherein the third grain size is in a range of about 5 A to about 2000 A.

13. The method of claim 1, wherein the bit line metal layer comprises ruthenium.

* * * * *